United States Patent [19]

Kurosawa et al.

[11] Patent Number: 5,357,898
[45] Date of Patent: Oct. 25, 1994

[54] METHOD OF PRODUCING SINGLE CRYSTAL AND APPARATUS THEREFOR

[75] Inventors: Hisao Kurosawa; Kohei Ito; Masayoshi Sato, all of Fukaya; Toru Abe, Kumagaya, all of Japan

[73] Assignee: Hitachi Metals, Ltd., Tokyo, Japan

[21] Appl. No.: 963,769

[22] Filed: Oct. 20, 1992

[30] Foreign Application Priority Data

Oct. 22, 1991 [JP] Japan .................. 3-273634

[51] Int. Cl.$^5$ ............................................ C30B 15/20
[52] U.S. Cl. ........................................................ 117/3
[58] Field of Search ................... 156/601, 602, 616.1, 156/616.4, DIG. 89, 245; 392/318, 338

[56] References Cited

U.S. PATENT DOCUMENTS

| | | | |
|---|---|---|---|
| 2,842,467 | 7/1958 | Landauer et al. | 156/602 |
| 3,058,915 | 10/1962 | Bennett | 156/602 |
| 4,135,963 | 1/1979 | Fukuda | 156/617.1 |
| 4,144,117 | 3/1979 | Fukuda et al. | 156/617.1 |
| 4,186,045 | 1/1980 | Gatos et al. | 156/602 |
| 4,330,359 | 5/1982 | Shlichta | 156/602 |
| 4,512,954 | 4/1985 | Matsui | 156/601 |

FOREIGN PATENT DOCUMENTS

| | | |
|---|---|---|
| 62-176993 | 8/1987 | Japan . |
| 64-27212 | 1/1989 | Japan . |
| 259495 | 2/1990 | Japan . |

OTHER PUBLICATIONS

*Electronics and Optics*, Thin Solid Films, 114, 1984, pp. 69–107, "Magnetic and Magneto-Optical Properties of Garnet Films", P. Hansen and J. P. Krume.

*Journal Of The Applied Magnetics Society Of Japan*, vol. 10, No. 2, 1986, p. 161, "Reduction of Optical Absorption in Bi Substituted Garnet Film by Annealing", M. Kaneko et al.

*J. Magn. Soc. Jpn.*, vol. 11, SI (1987), p. 347, "Growth of Bi-Substituted Garnet Thick Epitaxial Films for Optical Isolators", K. Machida and Y. Asahara.

*Journal Of The Applied Magnetics Society Of Japan*, vol. 10, No. 2, 1986, pp. 147–150, "Growth and Characterization of NiGd Garnet Thick Films on 2-Inch-Diameter $Nd_3Ga_5O_{12}$ Substrates", T. Ishikawa et al.

Primary Examiner—R. Bruce Breneman
Assistant Examiner—Felisa Garrett
Attorney, Agent, or Firm—Sughrue, Mion, Zinn, Macpeak & Seas

[57] ABSTRACT

In growing an oxide single crystal such as a garnet single crystal or ferrite single crystal by the liquid epitaxial process, the Bridgman process or the like, the melting-out of a platinum or platinum-based alloy-made crucible holding a melt for growing the crystal therefrom is prevented by bringing an electrode in contact with the melt or dipping the electrode into the melt in oxygen, air or an inert gas, applying electric current through the melt between the electrode and the metallic container and controlling the current so as to keep it at nearly zero.

6 Claims, 4 Drawing Sheets

METHOD OF PRODUCING SINGLE CRYSTAL AND APPARATUS THEREFOR

BACKGROUND OF THE INVENTION

1. Field of the Invention

The present invention relates to a method of producing a single crystal by growing from a melt contained in a metallic container, such as a crucible, made of a metal such as platinum or platinum-based alloys in oxygen, air or an inert atmosphere.

2. Description of Related Art

Bismuth (Bi)-substituted garnet single crystals suitable for magneto-optical devices such as a photo-isolator, photo-circulator and photo-switch which utilize the Faraday effect are generally grown by a liquid phase epitaxial (hereinafter referred to as "LPE") process. The photo-isolator is used for cutting off a reflecting-returning light from optical elements such as connectors and switches and for stably oscillating a semiconductor laser. The miniaturization of the photo-isolator has been rapidly made with increase in demands. For the miniaturization, it is essential to miniaturize the Faraday rotor which is a main part of the photo-isolator. The Faraday rotor has an action to rotate an incident-light polarizing plane by a given quantity (for example, 45°) and is needed to have a given length for the rotation. This length is in proportion to a Faraday rotation factor, and further miniaturization of the Faraday rotor requires to select a material having a higher Faraday rotation factor.

As the material high in the Faraday rotation factor, a so-called Bi-substituted magnetic garnet in the form of solid solution of Bi has been known, for example, in Japanese Patent Kokai (Laid-Open) No. 64-27212, and the Faraday rotation factor of this material increases in proportion to the amount of Bi substituted (see "Thin Solid Films", 114 (1984), pages 69–107). However, since the segregation coefficient of Bi for a garnet crystal is very small, it is very difficult to increase the substituted amount of Bi.

For substitution of Bi in a large amount in the LPE process, there have been proposed optimization of a component system and a composition of melt and optimization of LPE conditions (increase of a supercooling degree: saturation temperature—film growing temperature and lowering of a film growing temperature).

SUMMARY OF THE INVENTION

It has been found that the optimization of the LPE conditions and the lowering of the film growing temperature cause a metal container containing a melt for growing crystals to melt out and dissolve into the melt due to the melting of the crucible. It is known that the light absorption of a magneto-optical device increases when the metal, for example, platinum which melt out from the container and dissolve into the melt, incorporates into the film. (See "Journal of Japan Applied Magnetic Society", Vol. 10, No. 2, 1986, P. 161). Furthermore, it is known that the presence of platinum causes formation of defects in the films (see "Journal of Japan Magnetic Society", Vol. 11, SI, 1987, P. 347), and these defects cause the optical characteristics of the film to deteriorate (see "Journal of Japan Magnetic Society", Vol. 10, No. 2, 1986, P. 147).

The problem of the melting-out of a metal such as platinum from the metal container is not peculiar for preparation of the Bi-substituted magnetic garnet single crystal and this problem also occurs in growing of a ferrite single crystal by the Bridgman method, and various proposals have been made to inhibit the melting-out of the container. (See Japanese Patent Kokai (Laid-Open) Nos. 62-176993 and 02-59495.)

Therefore, the melting-out of a metal from containers is a serious problem. The uses of single crystals from which the above problem must be eliminated are, for example, a magneto-optical device, microwave device and magnetic head made of a ferrite single crystal and in these uses, the metal which melts out from a metallic container such as crucible incorporates into the melt, which invites deterioration of characteristics.

In addition to the problems of the film defects caused by platinum which acts as nuclei, there are also the problems such as shortening in the life of crucible, reduction in the yield of devices and increase in costs.

DETAILED DESCRIPTION OF PREFERRED EMBODIMENTS

In order to solve the above problems, the present invention provides a method for producing a single crystal by growing it from a melt of starting material oxides obtained by heating in a metallic container, such as a crucible, made of a metal such as platinum or platinum-based alloys, in which an electrode is dipped in the melt or contacted with the melt on the surface thereof and current is kept at nearly zero between the metallic container and the electrode dipped in the melt.

The inventors made extensive studies on the factors which cause the melting-out of a metallic container and have found that there exists a certain relation between the amount of the molten-out metal from the container and the current value through a melt in the container.

According to the present invention, the metal container is made mainly of platinum or a platinum alloy and the metallic container is not limited to a container made of a metal alone, but it may include a metallic container partially coated with, for example, ceramics or glass. Examples of the platinum alloys include Pt-10%Rh, Pt-0.2%Zr, Pt-5%Au or etc.

The inventors have found that the melting-out of metallic container is due to an electrochemical action. They measured an electric current between an electrode dipped in a melt in a container and the container as follows:

An electrode dipped in a melt or contacted with the melt on the surface thereof was connected to a positive terminal of a measuring device, and a container was connected to a negative terminal. The melt used for the studies was one for growing a bismuth-substituted garnet film, and the melt was held for about 10 hours. When the holding of the melt was finished, the melt was discharged, and the difference in the weight of the container before and after the holding of the melt was determined.

The relation between the current value through the melt and the amount of the container molten out (weight loss) is as shown in Table 1 below.

TABLE 1

| Current (mA) | Weight gain or loss of container (g) |
|---|---|
| −0.41 | +0.012 |
| −0.15 | +0.010 |
| +0.09 | ~0 |
| +0.39 | −0.158 |
| +0.40 | −0.201 |
| +0.42 | −0.253 |
| +0.43 | −0.255 |

As can be seen from Table 1, when the current is less than about 0.1 mA, the weight gain or loss is nearly zero. It can be seen from Table 1 that positive current flows when the container melts out, and the melting-out of the container progresses with increase in the current.

Figure 1:
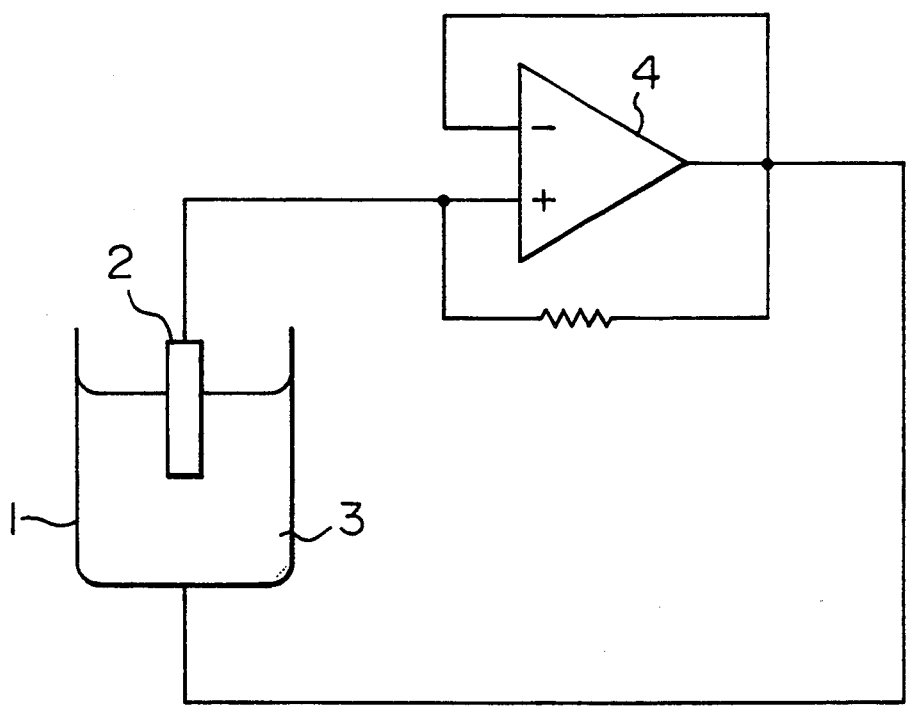
FIG. 1 is a circuit diagram showing the principal of current control according to the present invention.

It has been found that when current control is carried out in such a circuit as shown in FIG. 1 so that a current which passes between a container 1 and an electrode 2 dipped in a melt 3 becomes nearly zero, the melting-out of the container can be prevented.

Next, a single crystal-making apparatus including a current-controlling device, which can be used in the present invention, will be in more detail explained below. FIGS. 2-7 are diagrams showing some embodiments of the circuit for current control according to the present invention. In these FIGS. 2-7, the resistance of resistor 6 is indicated by Rs, the resistance of resistor 7 by Ra, the resistance of resistor 8 and resistor 12 by Rf, the resistance of resistor 11 and resistor 13 by Ri. A current passing between the electrode and the container is indicated by Io and the voltage of control signal 5 is indicated by Vi.

Figure 2:
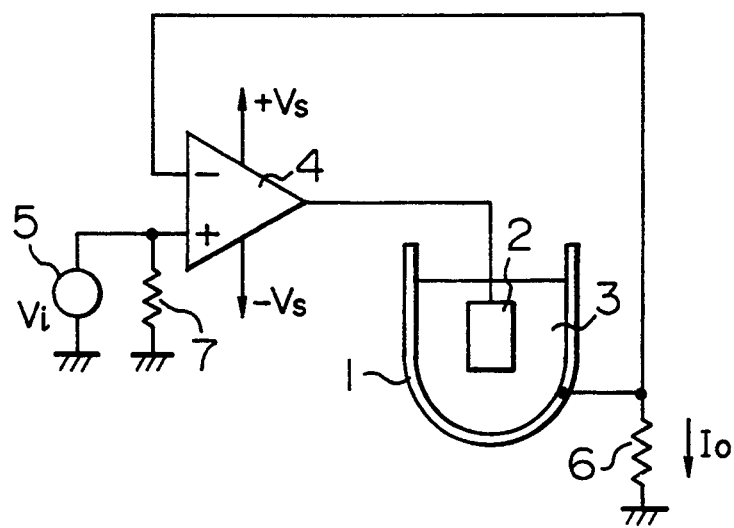
FIG. 2 is a diagram showing one embodiment of the circuit for current control according to in the present invention.

In FIG. 2, current Io is detected by resistor 6 (Rs) and the detected voltage Io.Rs is input into an inverted input terminal of amplifier 4. Control signal 5 (Vi) is input in the non-inverted input terminal of amplifier 4. Current Io is represented by the equation of Io=Vi/Rs.

In order to control current Io within a very small range of values, a very small voltage can be input for control signal 5. Specifically, current Io can be controlled by using as a control signal the offset voltage which an actual amplifier inherently possesses and adjusting this offset voltage by a given adjusting method (for example, by adjustment of a trimmer resistor provided in an operational amplifier).

Figure 3:
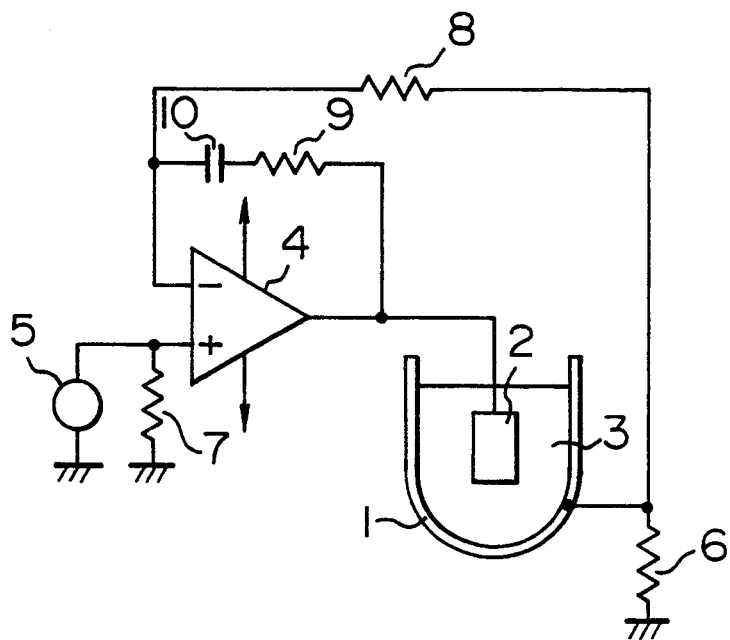
FIG. 3 is a diagram showing another embodiment of the circuit for current control according to the present invention.

FIG. 3 is a diagram showing an example of applying phase compensation. Current Io is controlled through Io=Vi/Rs. The phase control makes oscillation difficult to occur and makes it possible to grow a single crystal in a stable fashion.

Figure 4:
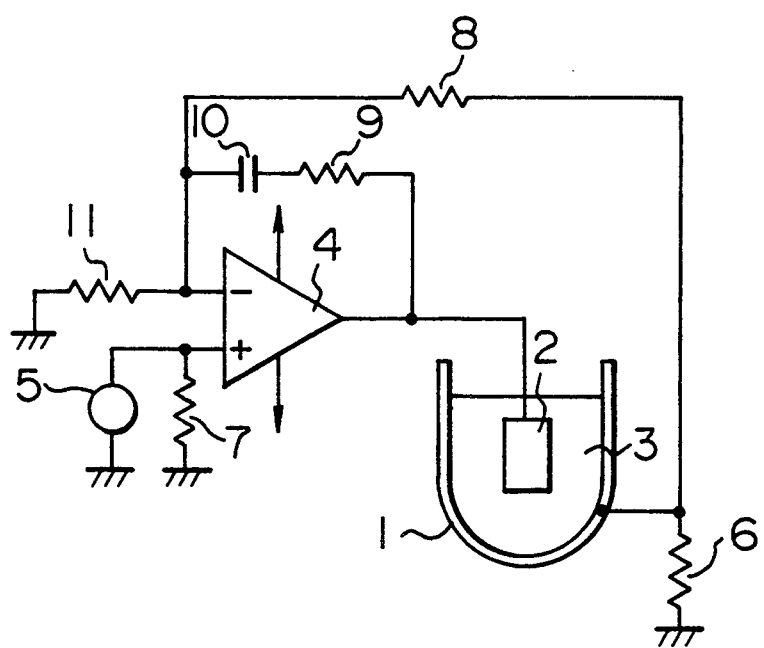
FIG. 4 is a diagram showing a further embodiment of the circuit for current control according to the present invention.

FIG. 4 is a diagram showing an example where the gain of the amplifier is increased. Current Io is controlled through Io=Vi(1+Rf/Ri)/Rs (Rs<<Rf, Rs<<Ri). In general, increase of the gain is not preferred for the purpose of the present invention to control the current to nearly zero. On the other hand, however, the gain may be increased for some uses to improve the response speed.

Figure 5:
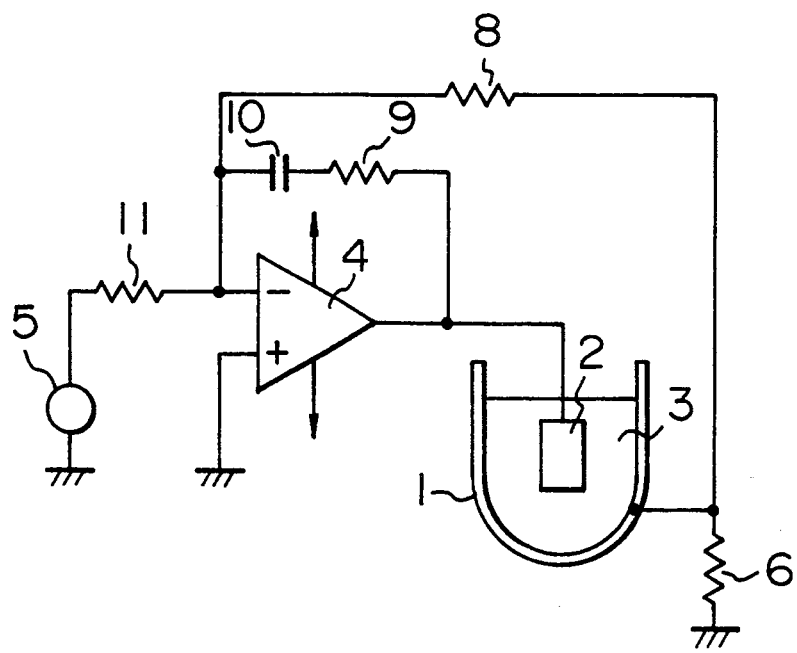
FIG. 5 is a diagram showing a still further embodiment of the circuit for current control according to the present invention.

FIG. 5 is a diagram showing an example of inverted amplification where a positive terminal of an operational amplifier is earthed. Current Io is controlled through Io=−ViRf/RsRi (Rs<<Rf, Rs<<Ri). This circuit stabilizes the operation and hence makes it possible to grow a single crystal in a stable fashion.

Figure 6:
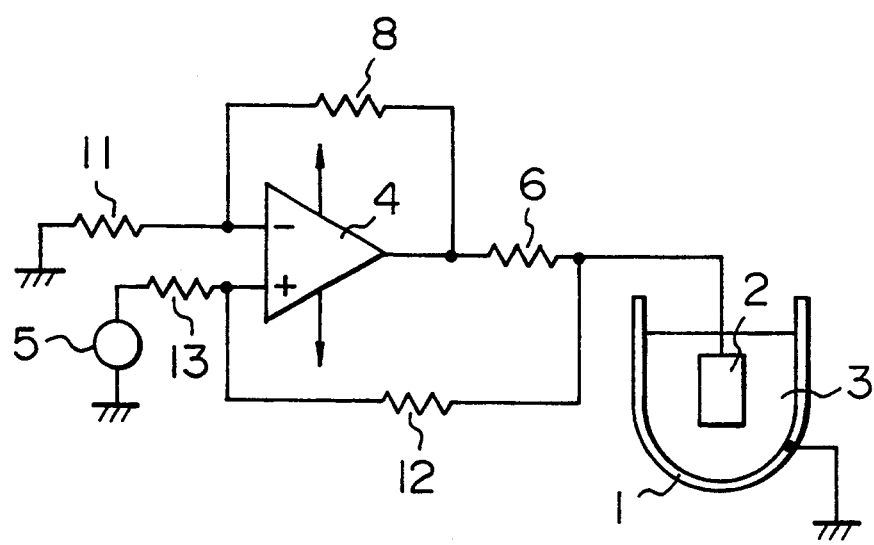
FIG. 6 is a diagram showing an additional embodiment of the circuit for current control according to the present invention.

FIG. 6 is a diagram showing an example where a crucible is earthed. Current Io is controlled through Io=ViRf/RsRi (Rs<<Rf, Rs<<Ri). By employing the circuit pattern as shown in FIG. 6, the circuits around the operational amplifier can be unified, thus making it possible to shorten a connection between the crucible and the operational amplifier. Therefore, the circuit hardly undergoes induction due to noises or the like, which makes it possible to grow a single crystal in a stable fashion.

Figure 7:
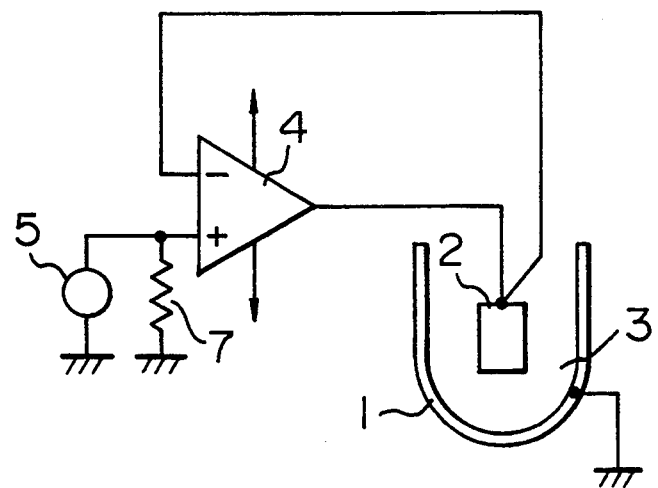
FIG. 7 is a diagram showing another additional embodiment of the circuit for current control according to the present invention.

FIG. 7 is a diagram showing an example wherein a current is controlled by regulating a potential difference between an electrode and a crucible. When the potential difference is indicated by Vo, controlling is made so that Vo equals to Vi. In this case, presetting of the correlation between Vo and Io makes it possible to control Io through Vo. Therefore, when the offset voltage of the amplifier is used as control signal 5 as aforementioned, current Io can be controlled within a very small range of values.

Some examples of using operational amplifiers are illustrated above. However, the present invention should not be limited to such operational amplifiers but may also use any other means capable of controlling current.

The present invention will be illustrated with reference to the following examples.

EXAMPLE 1

In order to make a magneto-optical device, about 206.7 g of $Bi_2O_3$, 0.9 g of $Tb_4O_7$, 0.8 g of $Gd_2O_3$, 35.6 g of $Fe_2O_3$, 198.0 g of PbO and 7.9 g of $B_2O_3$ were weighed and mixed. With the mixture was filled a platinum crucible of about 100 $cm^3$. This crucible was placed in air in a furnace to make a melt of the mixture, and the melt in the crucible was homogenized at 1100° C., then cooled to about 795° C. and kept at that temperature. An electrode was dipped in the melt with controlling observed current flow through the melt between the electrode and the crucible by applying external current flow in such a manner that the current was allowed to decrease to zero. The crucible was maintained in this state for about 41 hours. Then, the weight loss of the crucible was measured to find that the molten-out amount of crucible was about 0.13 g.

COMPARATIVE EXAMPLE 1

In order to make a magneto-optical device, about 206.7 g of $Bi_2O_3$, 0.9 g of $Tb_4O_7$, 0.8 g of $Gd_2O_3$, 35.6 g of $Fe_2O_3$, 198.0 g of PbO and 7.9 g of $B_2O_3$ were weighed and mixed. With the mixture was filled a platinum crucible of about 100 $cm^3$. This crucible was placed in air in a furnace to make a melt of the mixture. The melt in the crucible was homogenized at about 1100° C., then cooled to about 795° C. and kept at this temperature for about 41 hours. Thereafter, the weight loss of the crucible was measured to find that the molten-out amount of crucible was about 1.30 g.

EXAMPLE 2

In order to make a microwave device, about 7.1 g of $Y_2O_3$, 100.0 g of $Fe_2O_3$, 1365.6 g of PbO and 27.3 g of $B_2O_3$ were weighed and mixed. With the mixture was filled a platinum crucible of about 500 cm$^3$. This crucible was placed in air in a furnace to make a melt of the mixture. The melt in the crucible was homogenized at about 1200° C., then cooled to about 890° C. and kept at this temperature. An electrode was dipped in the melt with controlling observed current flow through the melt between the electrode and the crucible in such a manner that the current was allowed to decrease to zero. The crucible was maintained in this state for about 42 hours. Then, the weight loss of the crucible was measured to find that the molten-out amount of crucible was about 0.09 g.

Furthermore, the crucible was placed in an argon atmosphere in a furnace and the weight loss of the crucible was measured in the same manner as above to find the molten-out amount of only about 0.04 g. This shows that the use of an inert gas atmosphere is more effective or gives a synergistic effect to the present invention.

COMPARATIVE EXAMPLE 2

In order to make a microwave device, about 7.1 g of $Y_2O_3$, 100.0 g of $Fe_2O_3$, 1365.6 g of PbO and 27.3 g of $B_2O_3$ were weighed and mixed. With the mixture was filled a platinum crucible of about 500 cm$^3$. This crucible was placed in air in a furnace to make a melt of the mixture. The melt in the crucible was homogenized at about 1200° C., then cooled to about 890° C. and kept at that temperature for 42 hours. Then, the weight loss of the crucible was measured to find that the molten-out amount of crucible of about 1.71 g.

EXAMPLE 3

In order to obtain a ferrite single crystal, about 348 g of $MnCO_3$, about 239 g of ZnO and 1413 g of $Fe_2O_3$ were weighed and mixed. The mixture was calcined and ground at about 1200°–1300° C. A platinum crucible of 800 cm$^3$ was filled with the mixture. This crucible was placed in air in a furnace to make a melt which was kept at about 1650° C. An electrode was dipped in the melt. A current through the melt between the electrode and the crucible was measured by the Bridgman method. The current was controlled in such manner that it was allowed to decrease to zero. The crucible was maintained at that state for about 32 hours. Then, the weight loss of the crucible was measured to find that the molten-out amount of crucible was about 0.04 g.

When the resulting single crystal was used for a magnetic head, there were obtained good output signals less in noise than when a single crystal grown by a conventional method was used.

COMPARATIVE EXAMPLE 3

In order to obtain a ferrite single crystal, about 348 g of $MnCO_3$, 239 g of ZnO and 1413 g of $Fe_2O_3$ were weighed and mixed. The mixture was calcined and ground at about 1200°–1300° C. A platinum crucible of 800 cm$^3$ was filled with the mixture. This crucible was placed in air in a furnace and kept at about 1650° C. for 32 hours. Then, the weight loss of the crucible was measured to find that the molten-out amount of crucible was about 1.92 g.

EXAMPLE 4

In order to make a magneto-optical device, about 1378.3 g of $Bi_2O_3$, 6.0 g of $Tb_4O_7$, 5.3 g of $Gd_2O_3$, 237.4 g of $Fe_2O_3$, 1320.3 g of PbO and 52.7 g of $B_2O_3$ were weighed and mixed. With the mixture was filled a platinum crucible of about 700 cm$^3$. This crucible was placed in air in a furnace to make a melt of the mixture. The melt in the crucible was homogenized at 1100° C., and then cooled to about 795° C. and kept at that temperature. An electrode was dipped in the melt. A current through the melt between the electrode and the crucible was measured and controlled in such a manner that it was allowed to decrease to zero. A single crystal film was grown from the melt for about 37 hours. The resulting film of about 505 μm thick was observed on the surface thereof by an optical microscope of 50–1000 magnifications to find that it had a defect density of about 2 defects/cm$^2$.

COMPARATIVE EXAMPLE 4

In order to make a magneto-optical devices, about 1378.3 g of $Bi_2O_3$, 6.0 g of $Tb_4O_7$, 5.3 g of $Gd_2O_3$, 237.4 g of $Fe_2O_3$, 1320.3 g of PbO and 52.7 g of $B_2O_3$ were weighed and mixed. With the mixture was filled a platinum crucible of about 700 cm$^3$. This crucible was placed in air in a furnace to make a melt. The melt in the crucible was homogenized at about 1100° C., and then a single crystal film was grown at about 795° C. for about 37 hours. The resulting film of about 507 μm thick was observed on the surface thereof by an optical microscope of 50–1000 magnifications to find that it had a defect density of about 823 defects/cm$^2$.

According to the present invention, the melting-out of a metal container can be outstandingly prevented. Therefore, the metal amount which enters into the melt in the crystal-growing container decreases to great extent. As a result, the life of the container is prolonged, the yield improved and the costs reduced. Thus, the present invention is of very practical value.

What is claimed is:

1. A method for producing a single crystal, comprising filling a metallic container with a melt of raw material oxides and growing and solidifying a single crystal in a gas atmosphere from the melt, which comprises contacting or dipping an electrode into the melt, first applying an external current through the melt between the electrode and the metallic container and then controlling the current flow between the electrode and the metallic container to maintain the current flow through the melt at essentially zero, thereby preventing melt-out of the container.

2. The method according to claim 1, wherein the metallic container is a crucible made of platinum or platinum-based alloys.

3. The method according to claim 1, wherein the current between the electrode and the metallic container is 0.1 mA or less.

4. The method according to claim 1, wherein the growing of the single crystal is carried out by the liquid epitaxial process.

5. The method according to claim 1, wherein the growing of the single crystal is carried out by the Bridgman method.

6. The method according to claim 1, wherein the gas atmosphere covers the melt and is air or an inert gas.

* * * * *